United States Patent [19]

Young

[11] Patent Number: 4,681,778

[45] Date of Patent: Jul. 21, 1987

[54] METHOD AND APPARATUS FOR MAKING ELECTRICAL CONNECTIONS UTILIZING A DIELECTRIC-LIKE METAL FILM

[75] Inventor: Peter L. Young, South Barrington, Ill.

[73] Assignee: Optical Materials, Inc., Mercer Island, Wash.

[21] Appl. No.: 799,926

[22] Filed: Nov. 14, 1985

[51] Int. Cl.$^4$ ............................................. B05D 5/12
[52] U.S. Cl. ........................................ 427/96; 427/46; 427/53.1; 427/88; 29/851
[58] Field of Search ............ 427/96, 46, 53.1, 88; 29/825, 851

[56] References Cited

U.S. PATENT DOCUMENTS

| | | | |
|---|---|---|---|
| 3,801,366 | 4/1974 | Lemelson | 427/53.1 |
| 4,159,414 | 6/1979 | Suh | 29/851 |
| 4,480,779 | 11/1984 | Luc | 29/825 |
| 4,486,464 | 12/1984 | Young | 427/63 |

Primary Examiner—John D. Smith
Assistant Examiner—Vi D. Dang
Attorney, Agent, or Firm—Mason, Kolehmainen, Rathburn & Wyss

[57] ABSTRACT

A method and apparatus for making electrical connections between conductors on a substrate utilizes a dielectric-like metal film deposited on the substrate interconnecting the conductors to be connected. The dielectric-like film is deposited in the form of microscopic islands or columns that are spaced by microscopic distances, thus making the film non-conductive when deposited. When an electrical connection is desired, the dielectric-like film is melted by localized heating, for example, by a focused laser, thereby melting the individual metal islands and permitting them to flow together to make the film conductive.

9 Claims, 4 Drawing Figures

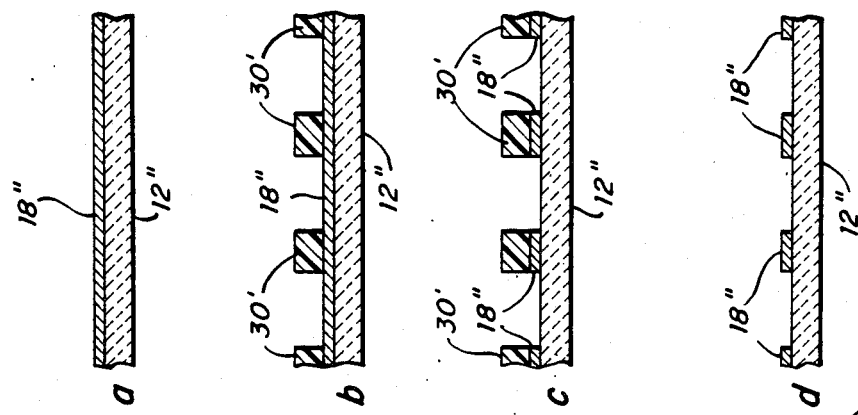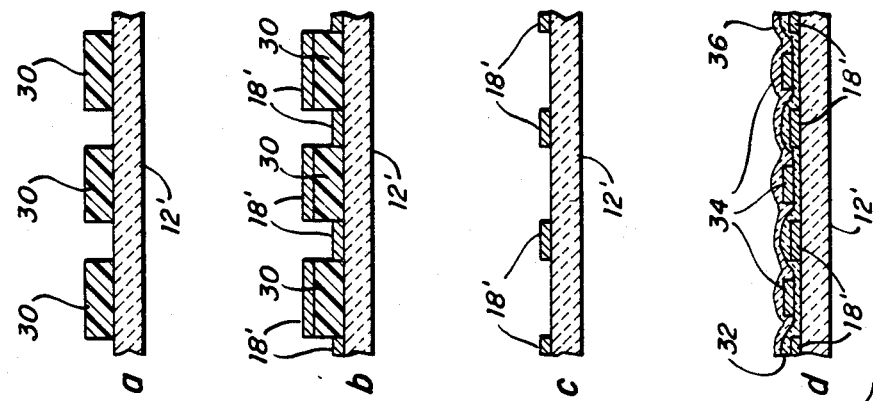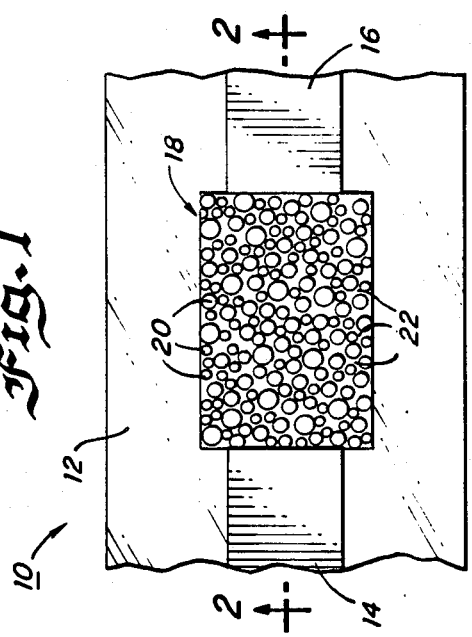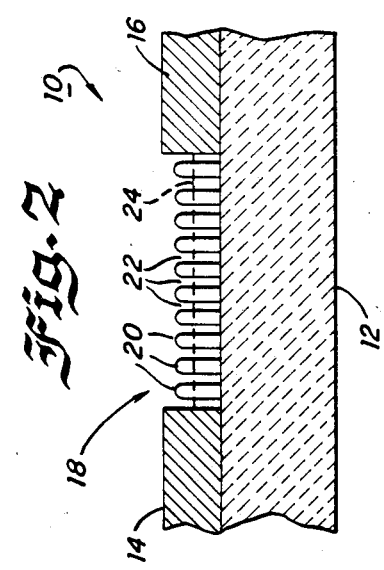

METHOD AND APPARATUS FOR MAKING ELECTRICAL CONNECTIONS UTILIZING A DIELECTRIC-LIKE METAL FILM

BACKGROUND OF THE INVENTION

1. Field of the Invention

This invention relates generally to semiconductor device fabrication, and more particularly to a method and apparatus for making electrical connections between predetermined areas on a semiconductor device.

2. Description of the Prior Art

In present semiconductor device fabrication technology, it is often necessary to utilize redundancy in order to improve fabrication yields as device density increases. In such semiconductor chips, redundant devices are fabricated, and if a device or portion of the chip is nonfunctional, a laser beam is used to cut the conductors on the surface of the semiconductor chip leading to the nonfunctional portion in order to isolate that portion from the properly functioning devices. This technique is now commonly utilized by semiconductor chip manufacturers when manufacturing, for example, 256K memory devices; however, the technique is usable only for breaking connections and cannot be used to create conductor lines for rerouting signals around a nonfunctional device.

One technique for creating conductive lines on a substrate is known as laser writing. In the laser writing process, the device is placed in a gas cell containing an organo-metallic gas such as tungsten carbonyl. A laser is focused on the area of the device where a line is to be written and causes the metal contained within the gas to be deposited on the device where the laser is focused. While this process does permit lines to be written, it is tedious and the laser must be focused very accurately. This critical focus requirement requires that the surface on which the line is being written be virtually planar, thus making it impossible to write lines over steps such as the steps caused by the etching and deposition processes of present semiconductor fabrication techniques. In addition, the gases used in laser writing techniques are highly toxic. Also, this technique can only form conductors on the surface of the chip, and not between layers.

SUMMARY OF THE INVENTION

Thus, it is an object of the present invention to overcome many of the disadvantages of the prior art systems.

It is another object of the present invention to provide a method for making electrical connections below the surface of the chip.

It is another object of the present invention to provide a method for writing conductor lines with well-controlled dimensions.

It is another object of the present invention to provide a conductor forming technique that does not require the use of a gas cell or the use of toxic gases.

It is another object of the present invention to provide a way to form conductor lines not only on the surface of a semiconductor device, but also in interior levels of the device.

It is another object of the present invention to provide a method for generating conductor lines rapidly to thereby improve the through-put of a conductor forming instrument.

Therefore, in accordance with a preferred embodiment of the invention, a non-conductive dielectric-like metal film formed from spaced microscopic pieces of metal in the form of columns or islands is deposited on the surface of a semi-conductor wafer wherever it is anticipated that an electrical connection may be required. The dielectric-like metal film can be covered by subsequent layers such as silicon dioxide, and subsequent layers of deposition or diffusion can be processed as usual.

When it is necessary to electrically interconnect two areas of the device, a laser beam is focused on the dielectric-like metal film between the conductor lines to be electrically connected. The laser beam heats the dielectric-like material to beyond its melting point, thereby reforming the dielectric-like film to a normal metal film to provide an electrical connection between the conductors. For long lines or complex geometries the laser beam can trace the necessary path between the areas to be connected. By focusing the laser on the appropriate layer, of the semiconductor chip, it is possible to interconnect conductors at various levels within the chip including conductors below the surface of the chip.

DESCRIPTION OF THE DRAWING

These and other objects and advantages of the present invention will become apparent upon consideration of the following detailed description and attached drawing, wherein:

FIG. 1 is a top view of a portion of a semiconductor device utilizing the interconnection technique according to the present invention;

FIG. 2 is a side cross-sectional view of the device of FIG. 1 taken along line 2—2 of FIG. 1; and FIGS. 3 and 4 illustrate how patterns of the dielectric-like metal film may be formed.

DETAILED DESCRIPTION OF THE PREFERRED EMBODIMENT

Referring now to the drawing, with particular attention to FIG. 1, there is shown a portion of a semiconductor device employing the conductor forming technique according to the invention. The device 10 includes a substrate 12 which may be any insulating substrate forming either part of a semiconductor chip or a substrate having disposed thereon several semiconductor chips. For example, the substrate 12 may be a silicon dioxide layer on a silicon chip, a substrate having thin metal conductors formed thereon separated by a dielectric (e.g. polyimide) on which several chips are mounted or any suitable insulating substrate compatible with semiconductor fabrication techniques. Deposited on the substrate 12 are two conductors 14 and 16 which may be various metal conductors suitable for use in conjunction with semiconductor fabrication techniques such as aluminum, gold, copper, polysilicon, etc. These conductors may also form part of a device to which it may be desired to make an electrical connection. The conductors 14 and 16 are disposed on the substrate 12 in a spaced relationship so that there is no direct electrical contact between them.

To provide for the possibility of having to provide an electrical connection between the conductors 14 and 16, a dielectric-like film is deposited in the gap between the conductors 14 and 16 and makes physical contact with both of the conductors 14 and 16. The property of the dielectric-like material 18 is such that it is normally non-conductive in the direction parallel to the surface of the insulating substrate 12, but becomes conductive upon heating by a laser or the like. The reason for this is that the dielectric-like film 18 is formed as a film of individual microscopic metal particles 20 that appear as columns 20 in FIGS. 1 and 2 separated by a plurality of spaces 22. Because of the spaces 22 between the particles 20, there is no electrical contact between the particles 20 and, hence, no electrical contact between the conductors 14 and 16. However, upon heating the film 18 to a temperature above the melting point of the individual particles 20, the individual particles melt, and upon cooling fuse together to form a continuous conductive surface between the conductors 14 and 16, as indicated by the dashed line 24 (FIG. 2). It should be noted that although very thin (300 Angstroms or less) conventional films may be discontinuous, such films cannot be converted to a continuous film by heating, as disclosed herein.

There are various methods and various metals that can be used to fabricate the dielectric-like film 18. One such method which is similar to a method disclosed in U.S. Pat. No. 4,486,464 and in U.S. application Ser. No. 771,252 filed Aug. 30, 1985 entitled Optical Recording Media and Method of Making the Media, both filed by the same inventor as the inventor of the present invention, and both incorporated herein by reference, utilizes a lead or a lead alloy to form the dielectric-like film 18. Such a film is formed by placing the substrate 12, which has been masked by conventional semiconductor masking techniques, as will be discussed in a subsequent portion of this specification, into a conventional vacuum chamber. The pressure in the vacuum chamber is evacuated until it is below $4 \times 10^{-6}$ torr. An inert gas such as argon is leaked into the vacuum system to bring the pressure up to the range of approximately $10 \times 10^{-3}$ torr to $500 \times 10^{-3}$ torr, preferably approximately $40 \times 10^{-3}$ torr. Then a film of lead or lead alloy is evaporated to form the film 18. Typically, when lead is used, it is evaporated at a rate to cause the film 18 to grow at a rate of approximately 1–40 Angstroms per second. Other metals such as gold and indium may be incorporated into the lead film. Each of the metals is evaporated in a separate boat as is disclosed in the aforementioned patent application. Typically, gold is evaporated at a rate to cause the film to grow at a rate of 1–10 Angstroms per second, and indium is evaporated at a rate of growth of 5–20 Angstroms per second. All of the metals may be evaporated sequentially to form a layered structure which may be later annealed at 70° C. to promote interdiffusion of the various layers. A final thickness of several thousand Angstroms is suitable for the present application.

The example illustrated in FIGS. 1 and 2 is a relatively simple example showing a relatively small area of dielectric-like film connecting two conductors, but as was previously stated, more complex structures can be obtained by utilizing semiconductor etching and deposition techniques. Two techniques suitable for such fabrication are known as lift off and subtractive etching. The lift off technique is illustrated in FIG. 3 and the subtractive etching technique is illustrated in FIG. 4. In the lift off technique, a positive photoresist pattern 30 is deposited on a substrate 12' (FIG. 3a). One such positive photoresist is the AZ 1350 photoresist, manufactured by the Shipley Co. of Newton, Mass. To achieve the photoresist pattern 30, the substrate 12' is coated in its entirety by photoresist material. The photoresist material is allowed to dry and is photolithographically exposed to define the pattern 30. The wafer is then dipped in a commercially available alkali photoresist developer such as, for example, the AZ developer also manufactured by the Shipley Co. which dissolves the exposed portions of the photoresist and leaves the unexposed pattern 30 in place. Metal to form the dielectric-like layer (layer 18', FIG. 3b) is then evaporated onto the substrate 12' in the manner previously described. The thickness of the layer 18' must be thinner than the thickness of the exposed photoresist pattern 30. The photoresist is then dissolved in a solvent such as acetone, and all of the dielectric-like film that was deposited on the photoresist pattern 30 is removed, thus leaving the desired pattern 18' on the substrate 12' (FIG. 3c). In subsequent processing steps, additional layers may be formed over the pattern 18'. For example, another insulating layer, such as, for example, a layer of silicon dioxide 32 (FIG. 3d) may be deposited over the substrate, and another metal or dielectric-like film layer 34, covered by another insulating layer 36, may be formed. If the pattern 34 is formed from dielectric-like material, the pattern 34 and the pattern 18' can selectively be made conductive by focusing the laser to the appropriate depth.

The subtractive etching method is illustrated in FIG. 4. In the subtractive etching process, the dielectric-like film such as a dielectric-like film 18" (FIG. 4a) is deposited over an entire substrate 12". A photoresist pattern 30' (FIG. 4b) is formed over the layer 18"; however, the pattern 30' is the negative of the pattern 30 of FIG. 3. The substrate 12" is then etched in a solution that reacts with the layer 18", thus removing the exposed positions of the layer 18" (FIG. 4c). The photoresist is then removed (FIG. 4d) to leave the pattern 18". As in the case of FIG. 4, subsequent layers may be added to the substrate 12".

A second method for fabricating a non-conducting metal film such as the dielectric-like film 18 utilizes silicon to form the film. In this system, the substrate is loaded into a high vacuum system and the pressure in the vacuum chamber is pumped to less than $5 \times 10^{-6}$ torr. By using electron beam evaporation or DC or RF sputtering, a film of silicon, typically several thousand Angstroms thick is deposited onto the substrate. The substrate is then removed from the deposition chamber and placed in a reactive ion etching machine. The chamber of the reactive ion etching machine is precoated with a layer of aluminum. After pumping down the vacuum of the etching machine to better than $1 \times 10^{-3}$ torr, the chamber is backfilled with an appropriate etching gas such as, tetraflouromethane ($CF_4$) or dichlorodiflouromethane ($CCL_2F_2$) together with an equal parts mixture of Argon and oxygen at a total partial pressure of approximately $20 \times 10^{-3}$ torr. The silicon film is then etched at a power density of 0.55 watts per square centimeter and a cathode self-bias of 500 volts. Because of the presence of the aluminum film in the etching chamber, the silicon film does not etch uniformly. Thin aluminum caps are formed randomly on top of the silicon film and act like etching masks for the silicon film underneath. The etching is continued long enough to etch the silicon sufficiently so that only electrically isolated columns or islands of silicon remain after the etching cycle has been completed. Similar phenomena were first described by H. W. Lehmann and R. Widmer in *J. Vac. Sci. Technol.*, 17, 1177 (1980) and by W. R. Hudson in *J. Vac. Sci. Technol.*, 14, 286 (1977). Subsequently, the application of this technique to fabricate thin film solar absorbers was described by H. G.

Craighead, R. E. Howard and D. M. Tennant, *Appl. Phys. Lett.*, 37, 653 (1980). The use of this technique in a particular recording media was described by H. G. Craighead and R. E. Howard in *Appl. Phys. Lett.*, 39, 532 (1981). However, in all of these applications, only the optical properties of the reactively etched silicon film are used.

After the silicon film has been etched sufficiently such that the silicon columns become essentially disconnected from each other, the substrate is taken out of the etching machine. When it is desired to render the film conductive, the silicon columns may be melted by localized heating (for example, laser heating) to form a smooth continuous film, thus changing the film from an electrically non-conducting state to an electrically conducting state. Thus, once a silicon film pattern, suitably etched as described above, is formed between two conducting lines on a semiconductor chip, an electrical connection between the two conductor lines may be readily achieved by simply applying localized heating to the etched silicon area where the connection is desired.

It should be noted that even though the examples illustrated in the foregoing illustrate the linking of conductors on a chip layer, the same techniques can be used to link conductor lines on other substrates, for example, conductor lines linking different chips that are mounted on a substrate.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for electrically connecting conductors on a substrate comprising,
   depositing an electrically non-conducting film containing a plurality of non-contacting microscopic conductive metal columns or islands on the substrate interconnecting the conductors to be electrically connected, and locally heating the film interconnecting the conductors to melt the columns or islands so that the metal forming the columns or islands flows together to render the film between the conductors conductive.

2. The method recited in claim 1 wherein said non-conducting film is a dielectric-like metal film.

3. The method recited in claim 2 wherein said dielectric-like metal film is deposited at a rate of approximately 1 Angstrom per second to 40 Angstroms per second by evaporating lead in the presence of an inert gas at a pressure of on the order of approximately $10 \times 10^{-3}$ torr to $500 \times 10^{-3}$ torr onto the substrate.

4. The method recited in claim 3 wherein said inert gas is argon.

5. The method recited in claim 2 wherein said non-conducting film is formed by depositing a silicon film on the substrate and etching the silicon film in a reactive ion etching machine in the presence of aluminum.

6. The method recited in claim 1 wherein said substrate is a semiconductor chip.

7. The method recited in claim 1 wherein the film is locally heated by a focused laser beam.

8. The method recited in claim 7 wherein said substrate has another layer disposed over the non-conducting film.

9. The method recited in claim 1 wherein said substrate has thin film conductor lines for connecting a plurality of semiconductor chips to be selectively connected.

* * * * *